(12) United States Patent
Shen

(10) Patent No.: US 7,682,053 B2
(45) Date of Patent: Mar. 23, 2010

(54) LIGHT-EMITTING DEVICE WITH A LONG LIFESPAN

(76) Inventor: Yu-Nung Shen, No. 60, Lane 328, Li-Shan St., Nei-Hu Dist., Taipei (TW)

( * ) Notice: Subject to any disclaimer, the term of this patent is extended or adjusted under 35 U.S.C. 154(b) by 176 days.

(21) Appl. No.: 11/932,687

(22) Filed: Oct. 31, 2007

(65) Prior Publication Data

US 2008/0158856 A1 Jul. 3, 2008

(30) Foreign Application Priority Data

Dec. 28, 2006 (TW) .............................. 95150104 A

(51) Int. Cl.
*F21V 29/00* (2006.01)
(52) U.S. Cl. ...................... 362/373; 362/294; 362/800; 362/218; 362/217.1; 257/98
(58) Field of Classification Search ................ 362/373, 362/294, 249.02, 240, 217.02, 217.1, 217.05, 362/217.07, 241, 296.01, 800, 218; 257/98–100
See application file for complete search history.

(56) References Cited

U.S. PATENT DOCUMENTS

| 5,119,174 | A | * | 6/1992 | Chen | ............................ | 257/98 |
| 7,066,626 | B2 | * | 6/2006 | Omata | ......................... | 362/257 |
| 7,128,454 | B2 | * | 10/2006 | Kim et al. | .................... | 362/507 |
| 2005/0099806 | A1 | * | 5/2005 | Tsai | ............................ | 362/218 |

* cited by examiner

*Primary Examiner*—Jong-Suk (James) Lee
*Assistant Examiner*—Robert J May
(74) *Attorney, Agent, or Firm*—Christie, Parker & Hale, LLP.

(57) ABSTRACT

A light-emitting device includes a housing, a light-emitting unit, a cup-shaped reflector, and a plurality of leads. The light-emitting unit is disposed in the housing. The cup-shaped reflector is disposed in the housing, and includes a base wall that is formed with a plurality of holes therethrough, and a surrounding wall that diverges from the base wall thereof and that surrounds the light-emitting unit. Each of the leads extends into the housing and is coupled electrically to the light-emitting unit.

12 Claims, 15 Drawing Sheets

LIGHT-EMITTING DEVICE WITH A LONG LIFESPAN

CROSS-REFERENCE TO RELATED APPLICATION

This application claims priority of Taiwanese application no. 095150104, filed on Dec. 28, 2006.

BACKGROUND OF THE INVENTION

1. Field of the Invention

This invention relates to a light-emitting device, more particularly to a light-emitting device capable of efficiently dissipating heat generated thereby.

2. Description of the Related Art

A conventional light-emitting device generates a large amount of heat, which causes rapid deterioration in the brightness thereof.

SUMMARY OF THE INVENTION

Therefore, the object of the present invention is to provide a light-emitting device that overcomes the aforesaid drawback of the prior art.

According to one aspect of the present invention, a light-emitting device comprises a housing, a light-emitting unit, a cup-shaped reflector, and a plurality of leads. The housing includes complementary first and second housing parts that cooperatively define an accommodating space therebetween. The light-emitting unit is disposed in the accommodating space in the housing, and includes at least one light-emitting chip that has a plurality of conductive contacts. The cup-shaped reflector is disposed in the accommodating space in the housing and is mounted on the first housing part for reflecting light emitted from the light-emitting chip of the light-emitting unit toward the second housing part. The cup-shaped reflector includes a base wall that is formed with a plurality of holes therethrough, and a surrounding wall that diverges from the base wall thereof and that surrounds the light-emitting unit. Each of the leads extends into the accommodating space in the housing, and is coupled electrically to a respective one of the conductive contacts of the light-emitting chip of the light-emitting unit.

According to another aspect of the present invention, a light-emitting device comprises first and second light-transmissible substrates, a plurality of electrical contacts, a light-emitting unit, a coupling unit, and a heat-dissipating unit. The first and second light-transmissible substrates cooperatively define an accommodating space. Each of the electrical contacts is disposed in the accommodating space. The light-emitting unit is disposed in the accommodating space, and includes at least one light-emitting chip that has a plurality of conductive contacts, each of which is coupled electrically to a respective one of the electrical contacts. The coupling unit is coupled electrically to the electrical contacts and adapted to be coupled electrically to a power source. The heat-dissipating unit includes at least one thermally conductive element. The thermally conductive element has a first end portion that is disposed in the accommodating space, and a second end portion that extends externally of the accommodating space.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
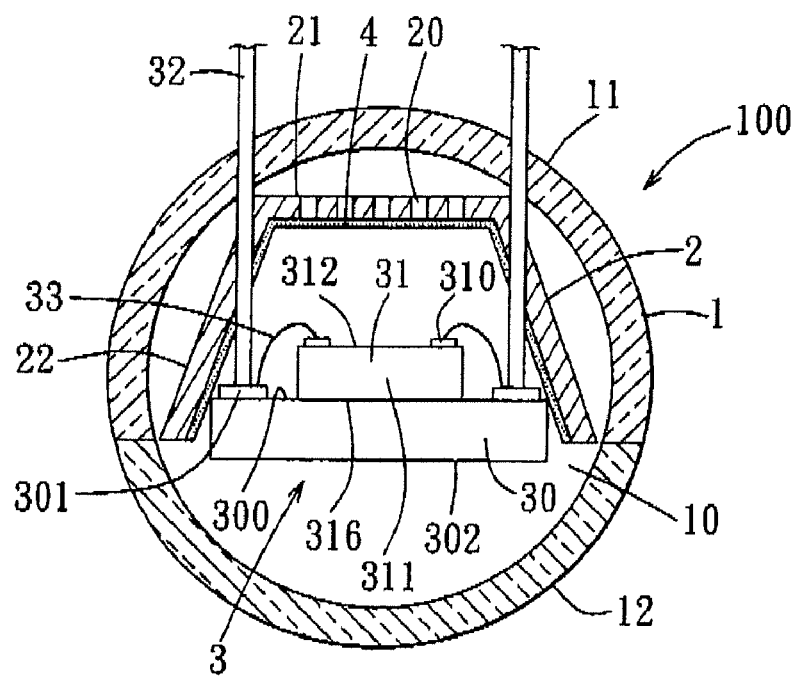
FIG. 1 is a fragmentary partly sectional view of the first preferred embodiment of a light-emitting device according to this invention.

Before the present invention is described in greater detail, it should be noted that like elements are denoted by the same reference numerals throughout the disclosure.

Referring to FIG. 1, the first preferred embodiment of a light-emitting device 100 according to this invention is shown to include a housing 1, a light-emitting unit 31, a cup-shaped reflector 2, and a pair of leads 32.

Figure 2:
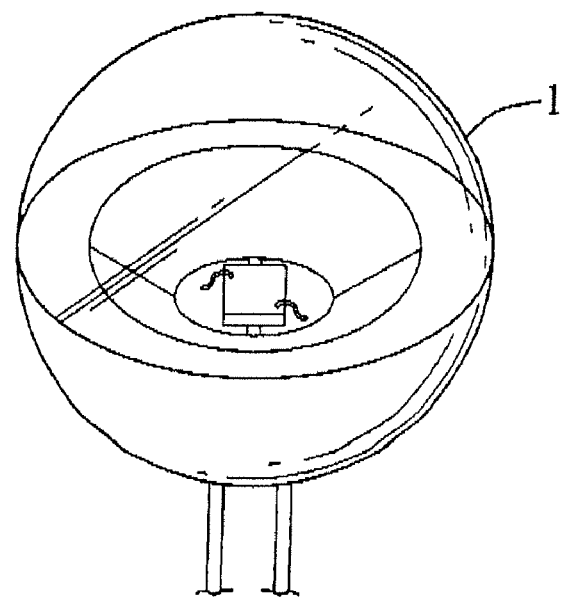
FIG. 2 is a perspective view of the first preferred embodiment.

The housing 1 includes complementary first and second housing parts 11, 12 that cooperatively define an accommodating space 10 therebetween. In this embodiment, the housing 1 is generally spherical in shape, as illustrated in FIG. 2.

The light-emitting device 100 further includes a mounting unit 3 that is disposed in the accommodating space 10 in the housing 1, and that includes a light-transmissible substrate 30, a pair of electrical contacts 301, and a pair of conductive wires 33. The light-transmissible substrate 30 has opposite first and second mounting surfaces 300, 302. Each of the electrical contacts 301 is mounted on the first mounting surface 300 of the light-transmissible substrate 30. In this embodiment, each of the electrical contacts 301 is made from an indium tin oxide material or an indium zinc oxide material.

The light-emitting unit 31 is disposed in the accommodating space 10 in the housing 1 and includes a light-emitting chip 311 mounted on the first mounting surface 300 of the light-transmissible substrate 30. In this embodiment, the light-emitting chip 311 has opposite first and second mounting surfaces 312, 316, and a pair of conductive contacts 310 mounted on the first mounting surface 312 thereof. In addition, the light-emitting chip 311 of the light-emitting unit 31 is one of a light-emitting diode chip, and a laser diode chip. Preferably, the light-emitting chip 311 of the light-emitting unit 31 emits one of a red light, a green light, and a blue light.

The cup-shaped reflector 2 is disposed in the accommodating space 10 in the housing 1 and is mounted on the first housing part 11 of the housing 1 for reflecting light emitted from the light-emitting chip 311 of the light-emitting unit 31 toward the second housing part 12. In particular, the cup-shaped reflector 2 includes a base wall 21, and a surrounding wall 22 that diverges from the base wall 21 and that surrounds the light-emitting unit 31.

It is noted that each of the first mounting surface 300 of the light-transmissible substrate 30 and the first mounting surface 312 of the light-emitting chip 311 of the light-emitting unit 31 faces and extends parallel to the base wall 21 of the cup-shaped reflector 2.

The base wall 21 of the cup-shaped reflector 2 is formed with a plurality of holes 20 therethrough. The construction as such permits air to circulate between the cup-shaped reflector 2 and the housing 1 to thereby reduce heat generated by the light-emitting chip 311 of the light-emitting unit 31.

Each of the conductive wires 33 of the mounting unit 3 interconnects a respective one of the electrical contacts 301 to a respective one of the conductive contacts 310 of the light-emitting chip 311 of the light-emitting unit 31.

The cup-shaped reflector 2 has an inner surface coated with a first fluorescent layer 4. In this embodiment, the first fluorescent layer 4 generates light of a wavelength in one of ranges from 400 nm to 470 nm, from 500 nm to 560 nm, from 600 nm to 620 nm, and from 250 nm to 380 nm when excited by light generated by the light-emitting chip 311 of the light-emitting unit 31.

In an alternative embodiment, the housing 1 may be coated with the first fluorescent layer 4.

Each of the leads 32 extends into the accommodating space 10 in the housing 1, and is connected electrically and directly to a respective one of the electrical contacts 301.

Figure 3:
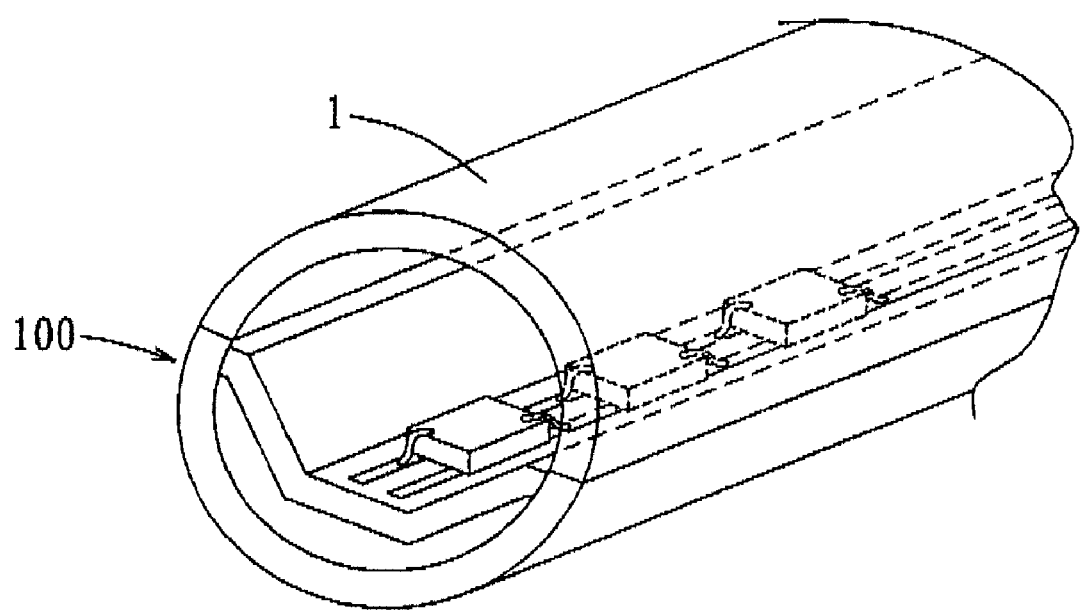
FIG. 3 is a perspective view of the second preferred embodiment of a light-emitting device according to this invention.
Figure 4:
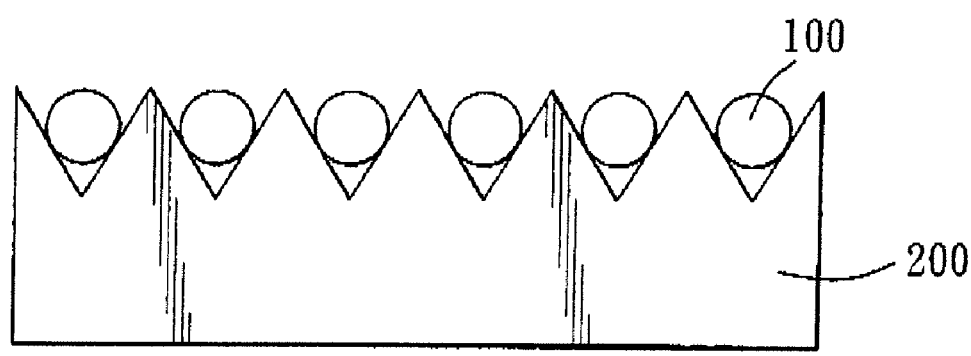
FIG. 4 is a schematic view to illustrate an exemplary application of the second preferred embodiment.

FIG. 3 illustrates the second preferred embodiment of a light-emitting device 100 according to this invention. When compared to the first preferred embodiment, the housing 1 is generally cylindrical in shape. The construction as such permits application of the light-emitting device 100 of this embodiment to backlight module devices 200, as illustrated in FIG. 4.

Figure 5:
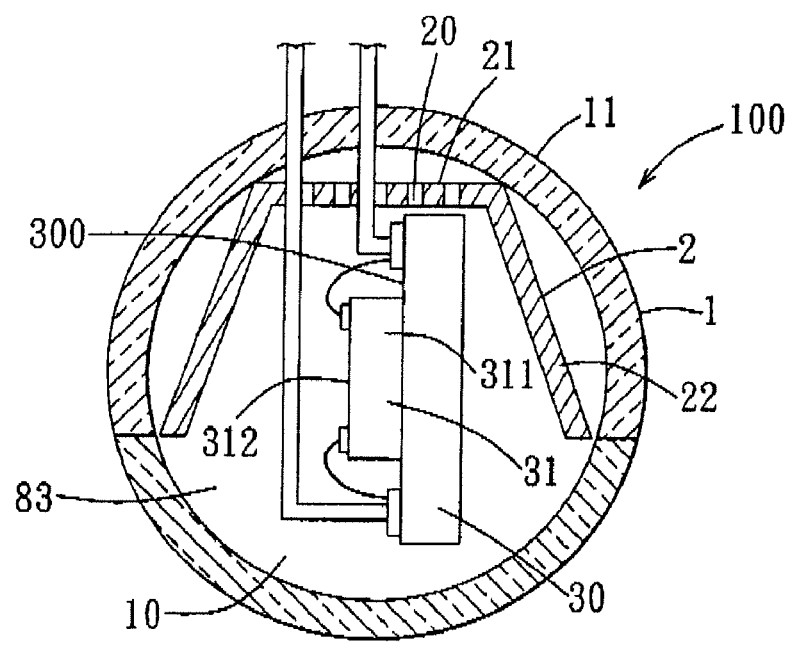
FIG. 5 is a fragmentary partly sectional view of the third preferred embodiment of a light-emitting device according to this invention.
Figure 6:
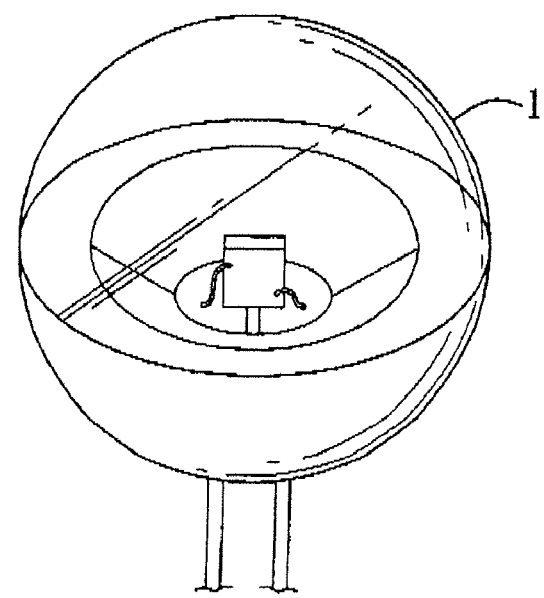
FIG. 6 is a perspective view of the third preferred embodiment.

FIGS. 5 and 6 illustrate the third preferred embodiment of a light-emitting device 100 according to this invention. When compared to the first preferred embodiment, each of the first mounting surface 300 of the light-transmissible substrate 30 and the first mounting surface 312 of the light-emitting chip 311 of the light-emitting unit 31 extends transversely to the base wall 21 of the cup-shaped reflector 2.

The light-emitting device 100 further includes a non-conductive coolant 83 contained in the accommodating space 10 in the housing 1. As such, the heat generated by the light-emitting unit 31 is conducted through the non-conductive coolant 83 to the first housing part 11 of the housing 1 via the holes 20.

In this embodiment, the non-conductive coolant 83 is mixed with fluorescent powder, and an anti-precipitant agent for preventing precipitation of the fluorescent powder.

Figure 7:
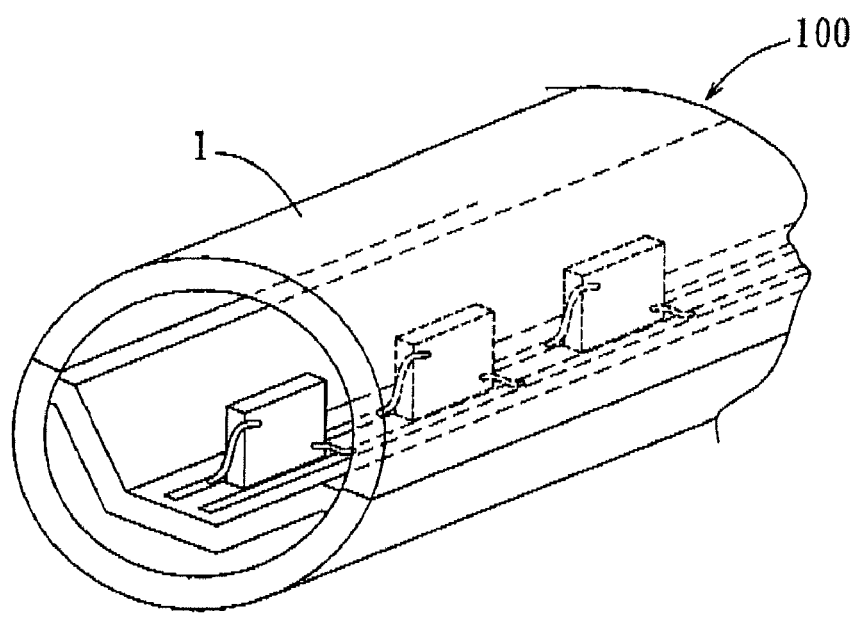
FIG. 7 is a perspective view of the fourth preferred embodiment of a light-emitting device according to this invention.

FIG. 7 illustrates the fourth preferred embodiment of a light-emitting device 100 according to this invention. When compared to the third preferred embodiment, the housing 1 is generally cylindrical in shape.

Figure 8:
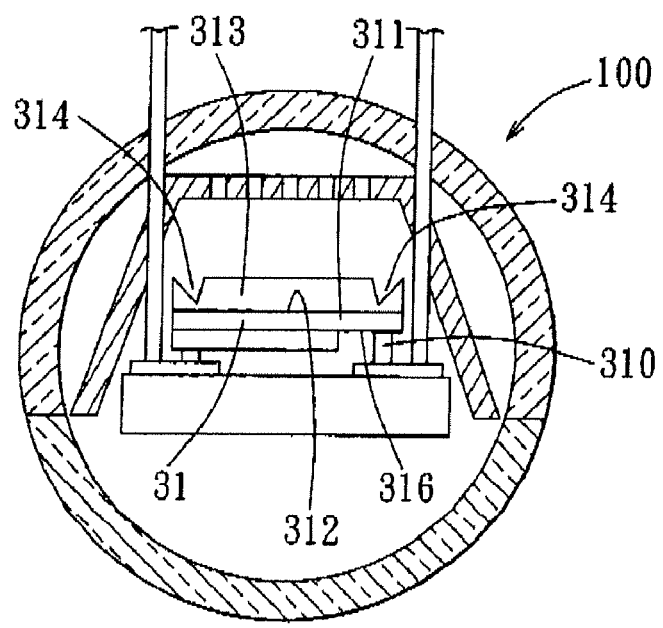
FIG. 8 is a fragmentary partly sectional view of the fifth preferred embodiment of a light-emitting device according to this invention.

FIG. 8 illustrates the fifth preferred embodiment of a light-emitting device 100 according to this invention. When compared to the first preferred embodiment, the light-emitting chip 311 of the light-emitting unit 31 is a flip chip, and includes a sapphire substrate 313 mounted on the first mounting surface 312 thereof. The conductive contacts 310 of the light-emitting chip 311 of the light-emitting unit 31 are mounted on the second mounting surface 316 thereof.

In this embodiment, the sapphire substrate 313 is formed with first and second V-shaped grooves 314 to thereby increase reflective efficiency thereof. Preferably, each of the V-shaped grooves 314 is defined by a pair of walls with different lengths.

Figure 9:
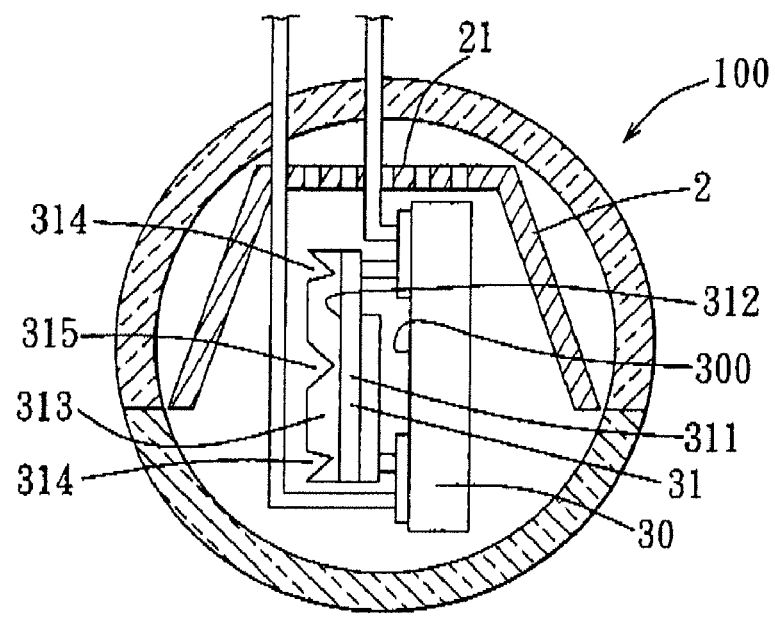
FIG. 9 is a fragmentary partly sectional view of the sixth preferred embodiment of a light-emitting device according to this invention.

FIG. 9 illustrates the sixth preferred embodiment of a light-emitting device 100 according to this invention, when compared to the fifth preferred embodiment, each of the first mounting surface 300 of the light-transmissible substrate 30 and the first mounting surface 312 of the light-emitting chip 311 of the light-emitting unit 31 extends transversely to the base wall 21 of the cup-shaped reflector 2.

In this embodiment, the sapphire substrate 313 is further formed with a third V-shaped groove 315 that is disposed between the first and second V-shaped grooves 314. Preferably, the third V-shaped groove 315 is defined by a pair of walls with the same lengths.

Figure 10:
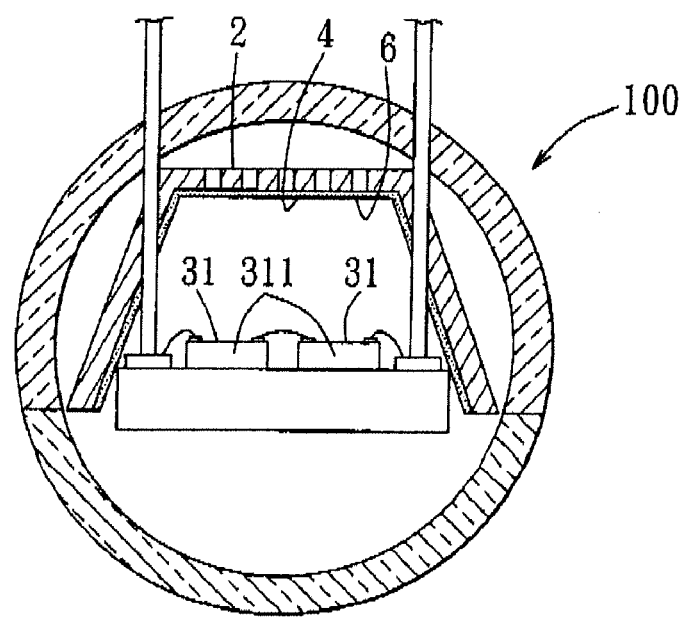
FIG. 10 is a fragmentary partly sectional view of the seventh preferred embodiment of a light-emitting device according to this invention.

FIG. 10 illustrates the seventh preferred embodiment of a light-emitting device 100 according to this invention. When compared to the first preferred embodiment, the light-emitting unit 31 includes two of the light-emitting chips 311 coupled electrically to each other. The inner surface of the cup-shaped reflector 2 is further coated with a second fluorescent layer 6, which has a wavelength different from that of the first fluorescent layer 4. Each of the first and second fluorescent layers 4, 6 emits light of a wavelength in one of ranges from 400 nm to 470 nm, from 500 nm to 560 nm, from 600 nm to 620 nm, and from 250 nm to 380 nm when excited by the light generated by the light-emitting chips 311 of the light-emitting unit 31.

Figure 11:
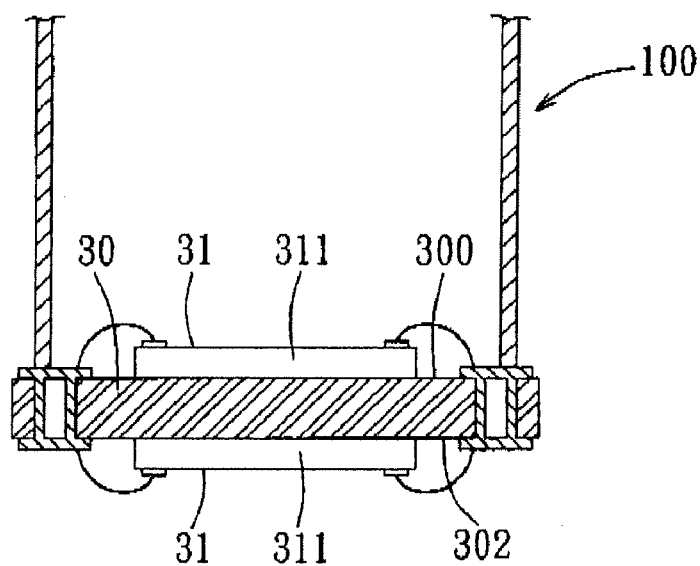
FIG. 11 is a fragmentary partly sectional view illustrating a light-transmissible substrate, a pair of leads, a pair of electrical contacts, and a pair of light-emitting chips of the eighth preferred embodiment of a light-emitting device according to this invention.

FIG. 11 illustrates the eight preferred embodiment of a light-emitting device 100 according to this invention. When compared to the first preferred embodiment, the light-emitting unit 31 includes a pair of the light-emitting chips 311, each of which is mounted on a respective one of the first and second mounting surfaces 300, 302 of the light-transmissible substrate 30.

Figure 12:
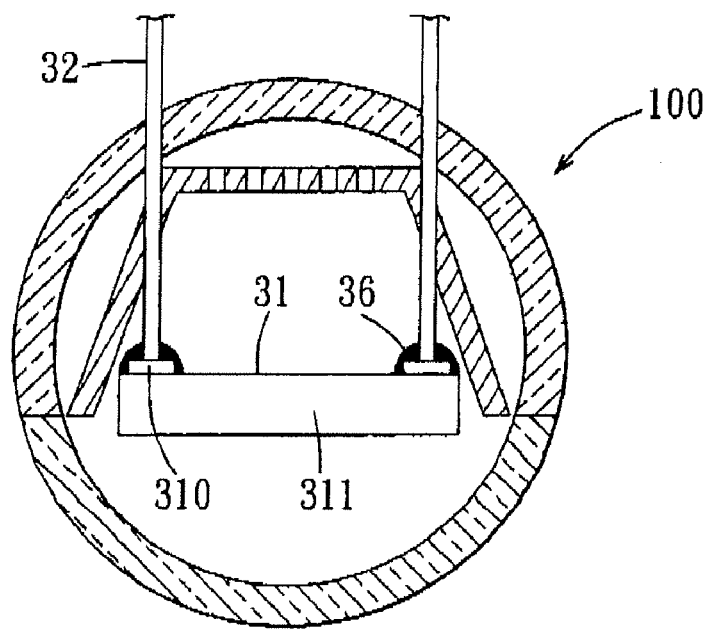
FIG. 12 is a fragmentary partly sectional view of the ninth preferred embodiment of a light-emitting device according to this invention.

FIG. 12 illustrates the ninth preferred embodiment of a light-emitting device 100 according to this invention. When compared to the first preferred embodiment, the mounting unit 3 (see FIG. 1) is dispensed with, and each of the leads 32 is connected directly and electrically to a respective one of the conductive contacts 310 of the light-emitting chip 311 of the light-emitting unit 31.

The light-emitting device 100 of this embodiment further includes a transparent adhesive material 36 provided at a junction of a respective one of the leads 32 and a respective one of the conductive contacts 310 of the light-emitting chip 311 of the light-emitting unit 31.

Figure 13:
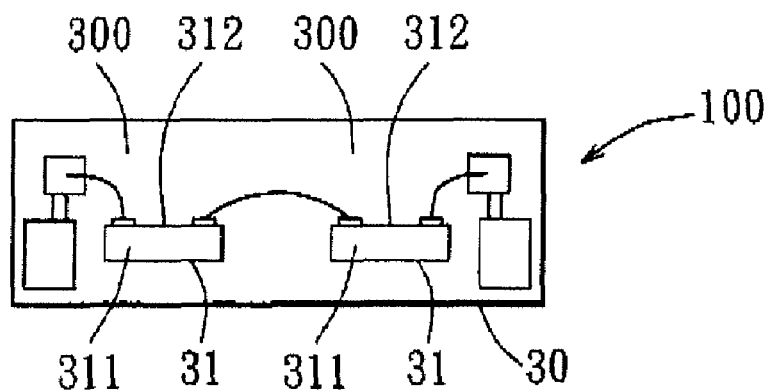
FIG. 13 is a schematic view illustrating a light-transmissible substrate, a pair of electrical contacts, and a pair of light-emitting chips of the tenth preferred embodiment of a light-emitting device according to this invention.

FIG. 13 illustrates the tenth preferred embodiment of a light-emitting device 100 according to this invention. When compared to the first preferred embodiment, the light-emitting unit 31 includes a pair of the light-emitting chips 311. The first mounting surface 312 of each of the light-emitting chips 311 of the light-emitting unit 31 extends transversely to the base wall 21 of the cup-shaped reflector 2 (see FIG. 1).

Figure 14:
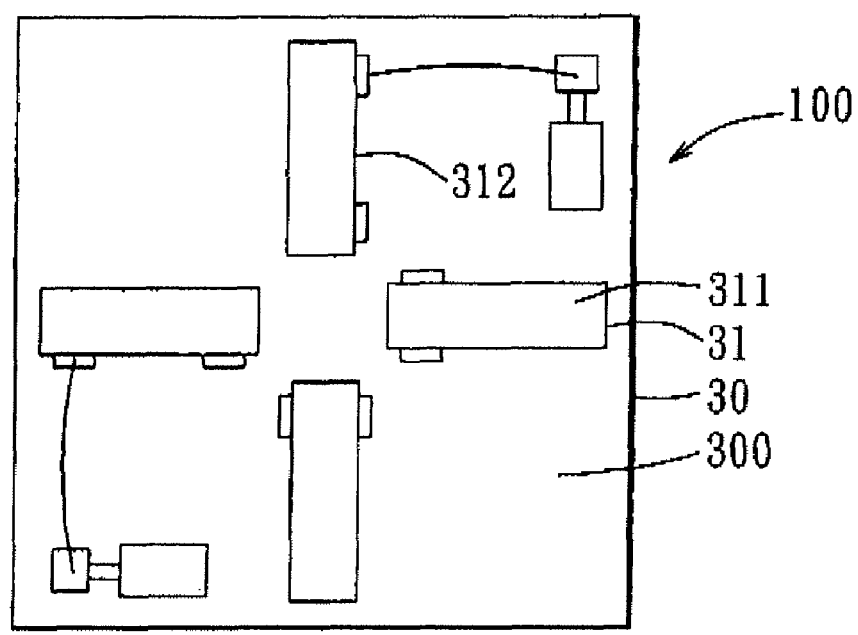
FIG. 14 is a schematic view illustrating a light-transmissible substrate, a pair of electrical contacts, and two pairs of light-emitting chips of the eleventh preferred embodiment of a light-emitting device according to this invention.

FIG. 14 illustrates the eleventh preferred embodiment of a light-emitting device 100 according to this invention. When compared to the first preferred embodiment, the light-emitting unit 31 includes four of the light-emitting chips 311 that are equiangularly displaced. The first mounting surface 312 of each of the light-emitting chips 311 of the light-emitting unit 31 extends transversely to the base wall 21 of the cup-shaped reflector 2 (see FIG. 1).

Figure 15:
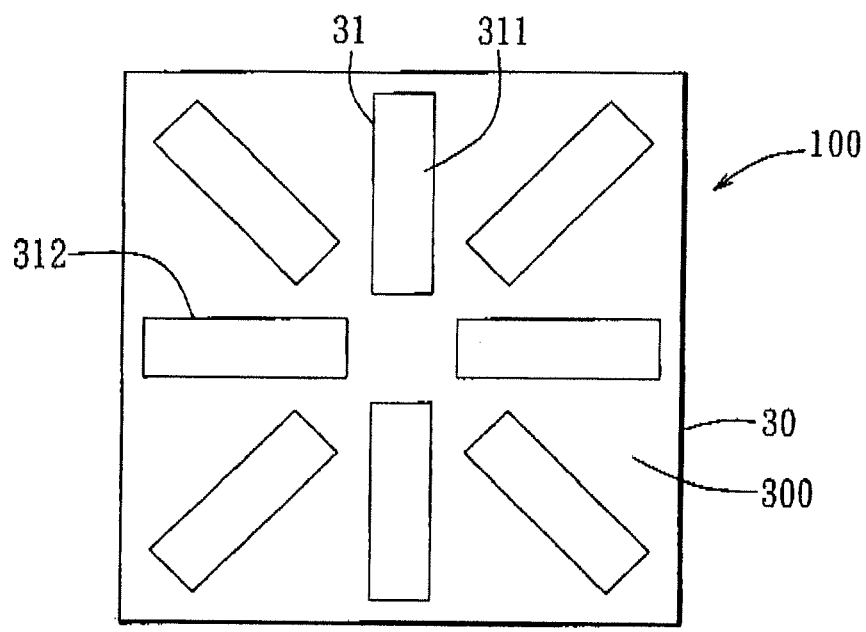
FIG. 15 is a schematic view illustrating a light-transmissible substrate, a pair of electrical contacts, and four pairs of light-emitting chips of the twelfth preferred embodiment of a light-emitting device according to this invention.

FIG. 15 illustrates the twelfth preferred embodiment of a light-emitting device 100 according to this invention. When compared to the first preferred embodiment, the light-emitting unit 31 includes eight of the light-emitting chips 311 that are equiangularly displaced. The first mounting surface 312 of each of the light-emitting chips 311 of the light-emitting unit 31 extends transversely to the base wall 21 of the cup-shaped reflector 2 (see FIG. 1).

Figure 16:
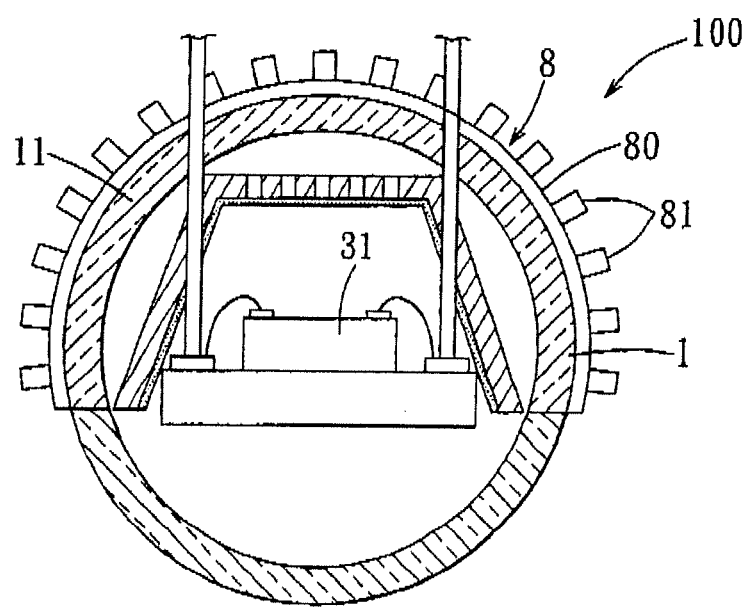
FIG. 16 is a fragmentary partly sectional view of the thirteenth preferred embodiment of a light-emitting device according to this invention.

FIG. 16 illustrates the thirteenth preferred embodiment of a light-emitting device 100 according to this invention. When compared to the first preferred embodiment, the light-emitting device 100 further includes a heat-dissipating unit 8 for dissipating heat generated by the light-emitting unit 31. In this embodiment, the heat-dissipating device 8 includes a thermally conductive base 80 and a plurality of thermally conductive fins 81. The thermally conductive base 80 is disposed externally of the housing 1, and is mounted on and in contact with the first housing part 11 of the housing 1. Each of the thermally conductive fins 81 is disposed externally of the housing 1 and extends from the thermally conductive base 80. As such, the heat generated by the light-emitting unit 31 is conducted through the housing 1, and is transferred to the thermally conductive base 80 and eventually to the thermally conductive fins 81 for dissipation therefrom.

In an alternative embodiment, the light-emitting device 100 further includes a non-conductive coolant (not shown) contained in the accommodating space 10 in the housing 1. As such, the heat generated by the light-emitting unit 31 is conducted through the non-conductive coolant 83 and the housing 1, and is transferred to the thermally conductive base 80 and eventually to the thermally conductive fins 81 for dissipation therefrom.

Figure 17:
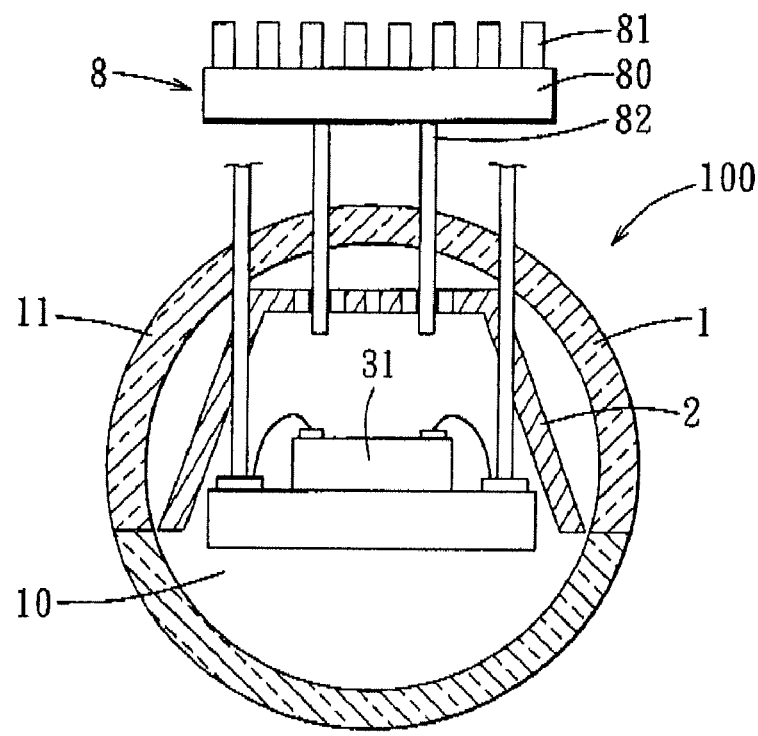
FIG. 17 is a fragmentary partly sectional view of the fourteenth preferred embodiment of a light-emitting device according to this invention.

FIG. 17 illustrates the fourteenth preferred embodiment of a light-emitting device 100 according to this invention. When compared to the thirteenth embodiment, the thermally conductive base 80 and the thermally conductive fins 81 of the heat-dissipating unit 8 is disposed externally of the housing 1 and in such a manner that the thermally conductive base 80 and the thermally conductive fins 81 are spaced apart from the housing 1. The heat-dissipating unit 8 further includes a pair of thermally conductive elements 82, each of which extends from the thermally conductive base 80 thereof into the accommodating space 10 in the housing 1 through the first housing part 11 and the cup-shaped reflector 2. As such, the heat generated by the light-emitting unit 31 is conducted through the thermally conductive elements 82, and is transferred to the thermally conductive base 80 and eventually to the thermally conductive fins 81 for dissipation therefrom.

Figure 18:
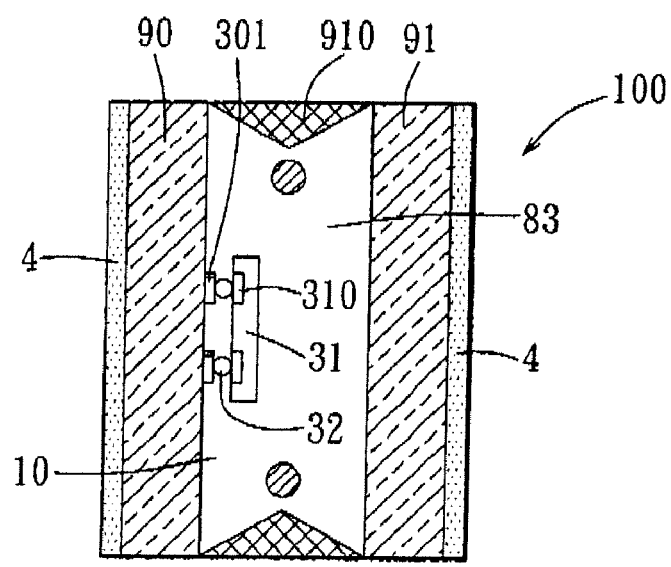
FIG. 18 is a partly sectional view of the fifteenth preferred embodiment of a light-emitting device according to this invention.
Figure 19:
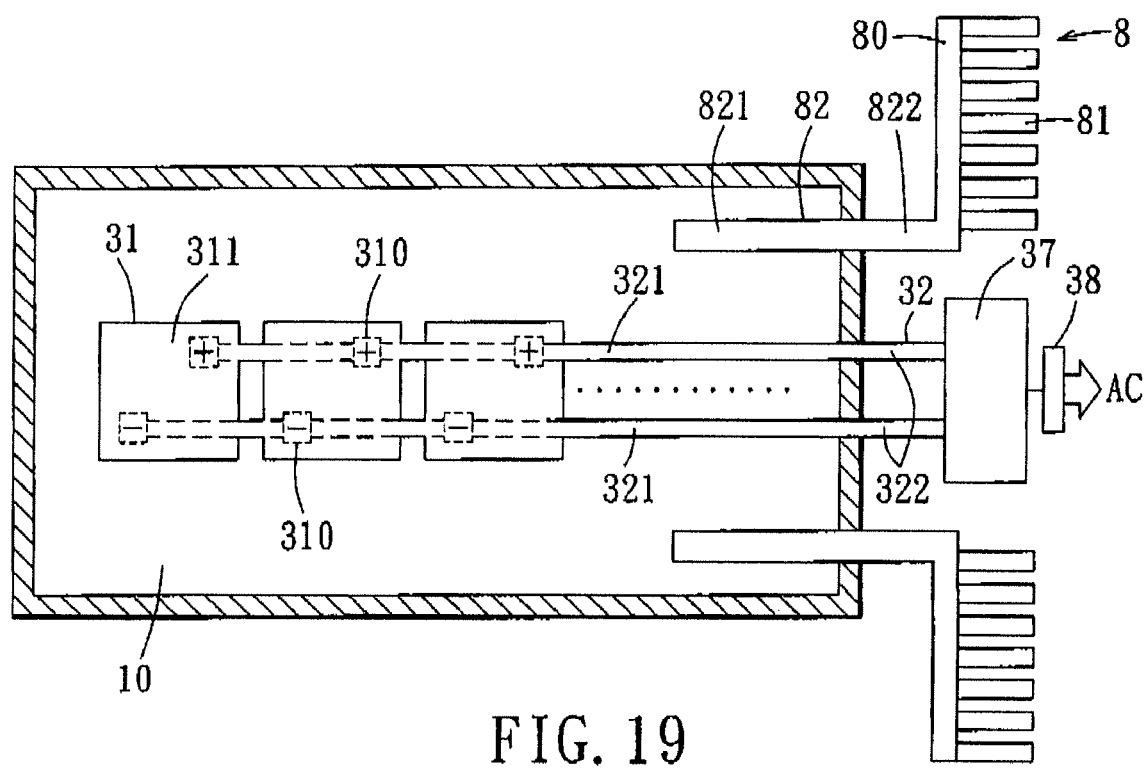
FIG. 19 is a partly sectional view illustrating a heat-dissipating unit of the fifteenth preferred embodiment.

Referring to FIGS. 18 and 19, the fifteenth preferred embodiment of a light-emitting device 100 according to this invention includes first and second light-transmissible substrates 90, 91, a plurality of pairs of electrical contacts 301, a plurality of light-emitting units 31, a coupling unit 38, and a heat-dissipating unit 8.

Since the pairs of the electrical contacts 301 are identical in structure, only one of the pairs of the electrical contacts 301 will be described herein.

The first and second light-transmissible substrates 90, 91 cooperatively define an accommodating space 10 therebetween. In this embodiment, the first and second transmissible substrates 90, 91 are attached to each other with the use of a transparent adhesive material 910.

Each of the electrical contacts 301 is disposed in the accommodating space 10 and is mounted on an inner surface of the first light-transmissible substrate 90. In this embodiment, each of the electrical contacts 301 is made from an indium tin oxide material or an indium zinc oxide material.

The light-emitting unit 31 is disposed in the accommodating space 10, is mounted on the inner surface of the first transmissible substrate 90, and includes a plurality of light-emitting chips 311, each of which has pair of conductive contacts 310. In this embodiment, each of the light-emitting chips 311 of the light-emitting unit 31 is one of a light-emitting diode chip and a laser diode chip. Preferably, each of the light-emitting chips 311 of the light-emitting unit 31 emits one of a red light, a green light, and a blue light.

Since the light-emitting chips 311 are identical in structure, only one of the light-emitting chips 311 will be described herein.

The light-emitting device 100 further includes a pair of leads 32, each of which has first and second end portions 321, 322. The first end portion 321 of each of the leads 32 is disposed in the accommodating space 10, is connected electrically to a respective one of the electrical contacts 301 and a respective one of the conductive contacts 310 of the light-emitting chip 311 of the light-emitting unit 31. The second end portion 322 of each of the leads 32 extends externally of the accommodating space 10.

The light-emitting device 100 further includes an alternating current to direct current (ac-to-dc) converter 37 that has input and output sides. The output side of the ac-to-dc converter 37 is connected electrically to the second end portions 322 of the leads 32.

The coupling unit 38 is disposed externally of the accommodating space 10, is connected electrically to the input side of the ac-to-dc converter 37, and is adapted to be coupled electrically to an ac power source (AC).

Figure 20:
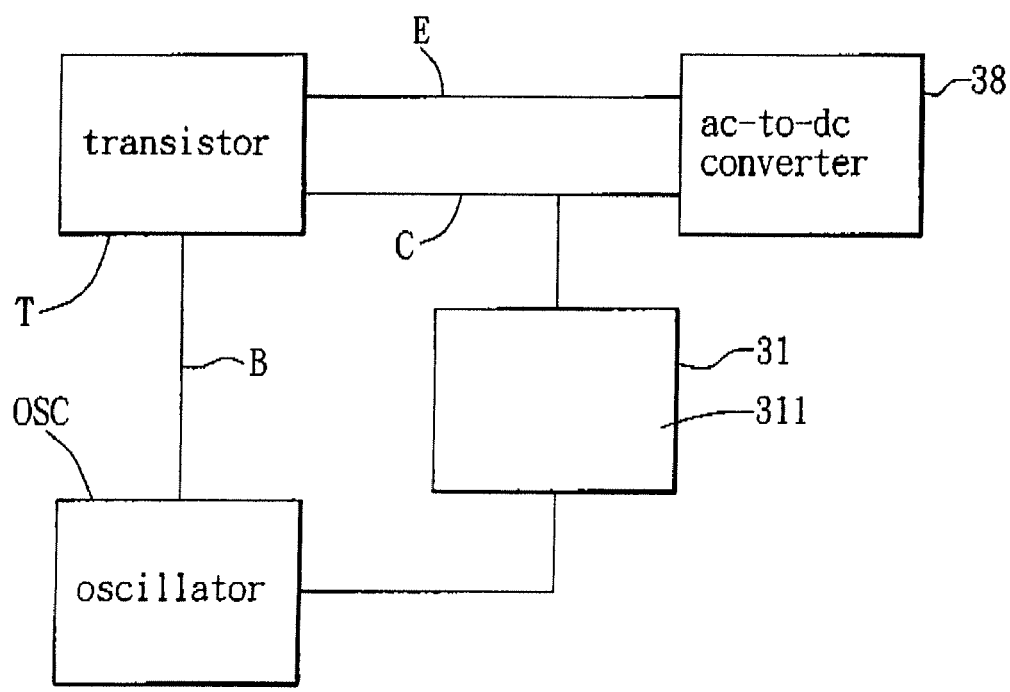
FIG. 20 is a circuit block diagram illustrating an alternating current to direct current converter of the fifteenth preferred embodiment.

With further reference to FIG. 20, the light-emitting device 100 further includes a transistor (T) and an oscillator (OSC). The transistor (T) has an emitter (E) and a collector (C) connected electrically to the ac-to-dc converter 38, and a base (B) connected electrically to the oscillator (OSC). Each of the conductive contacts 310 of the light-emitting chip 311 of the light-emitting unit 31 is connected electrically to a respective one of the collector (C) of the transistor (T) and the oscillator (OSC).

In operation, when the oscillator (OSC) generates electrical oscillations, the transistor (T) is turned off and on alternately to thereby cause the light-emitting chip 311 of the light-emitting unit 31 to emit light intermittently.

The heat-dissipating unit 8 serves to dissipate heat generated by the light-emitting chip 311 of the light-emitting unit 31. In particular, the heat-dissipating unit 8 includes a pair of thermally conductive bases 80, a pair of thermally conductive fin units 81, and a pair of thermally conductive elements 82. Each of the thermally conductive bases 80 is disposed externally of the accommodating space 10. Each of the thermally conductive fin units 81 includes a plurality of fins, is disposed externally of the accommodating space 10, and extends from a respective one of the thermally conductive bases 80 Each of the thermally conductive elements 82 has a first end portion 821 that is disposed in the accommodating space 10, and a second end portion 822 that extends externally of the accommodating space 10 and that is connected to a respective one of the thermally conductive bases 80.

The light-emitting device 100 further includes a non-conductive coolant 83 contained in the accommodating space 10. As such, the heat generated by the light-emitting unit 31 is conducted through the non-conductive coolant 83 and the thermally conductive elements 82, and is transferred to the thermally conductive bases 80 and eventually to the thermally conductive fin units 81 for dissipation therefrom.

In an alternative embodiment, the non-conductive coolant 83 is mixed with fluorescent powder, and an anti-precipitant agent for preventing precipitation of the fluorescent powder.

The light-emitting device 100 further includes a fluorescent layer 4 coated on outer surfaces of the first and second light-transmissible substrates 90, 91.

The fluorescent layer generates light of a wavelength in one of ranges from 400 nm to 470 nm, from 500 nm to 560 nm, from 600 nm to 620 nm, and from 250 nm to 380 nm when excited by the light generated by the light-emitting chip 311 of the light-emitting unit 31.

Figure 21:
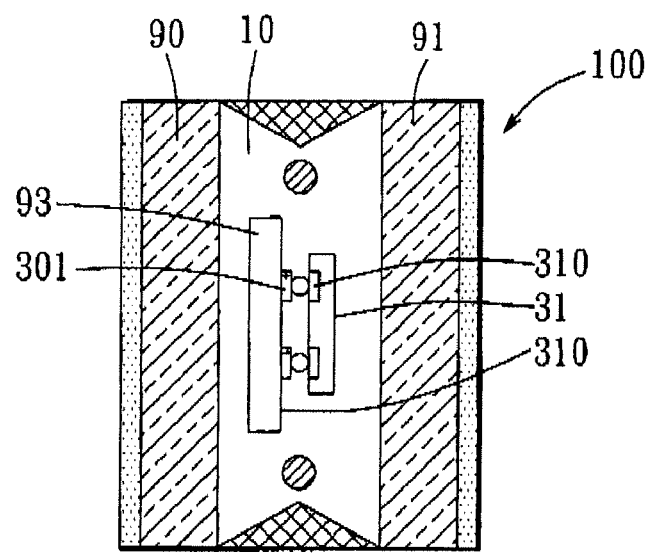
FIG. 21 is a partly sectional view of the sixteenth preferred embodiment of a light-emitting device according to this invention.
Figure 22:
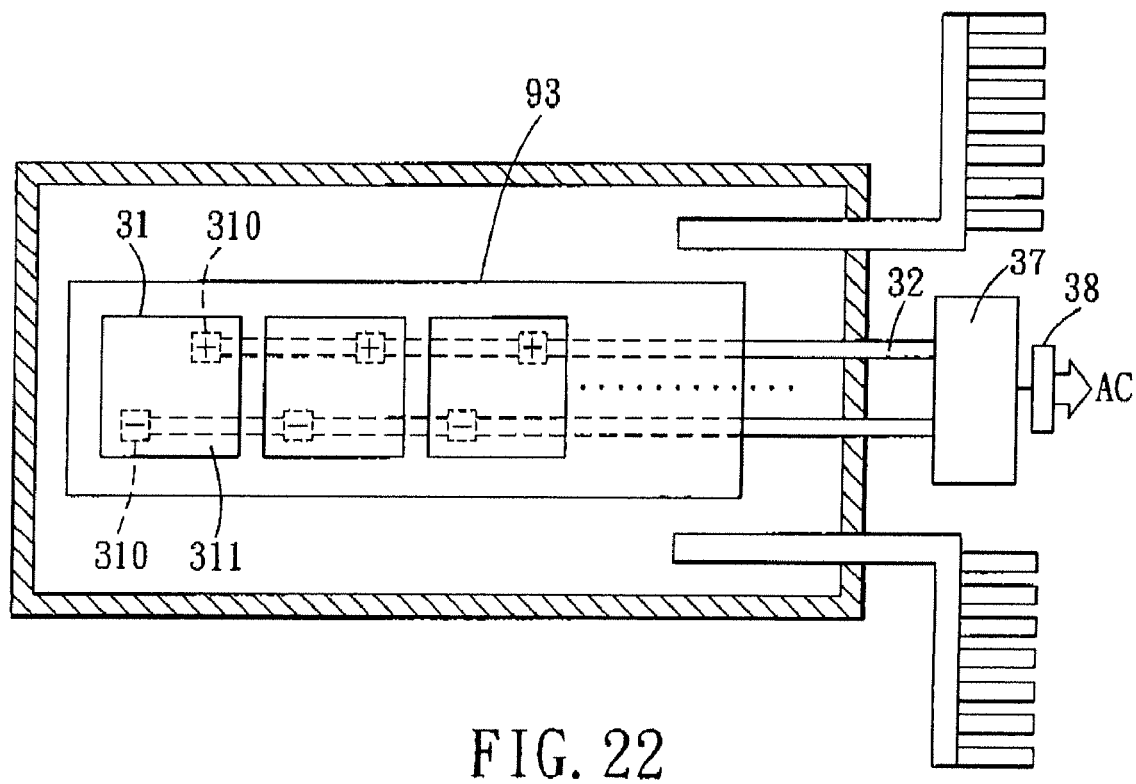
FIG. 22 is a partly sectional view illustrating a heat-dissipating unit of the sixteenth preferred embodiment.

FIGS. 21 and 22 illustrate the sixteenth preferred embodiment of a light-emitting device 100 according to this invention. When compared to the fifteenth preferred embodiment, the light-emitting device 100 further includes a third light-transmissible substrate 93 disposed in the accommodating space 10. The electrical contacts 301 and the light-emitting chip 311 of the light-emitting unit 31 are mounted on the third light-transmissible substrate 93.

Figure 23:
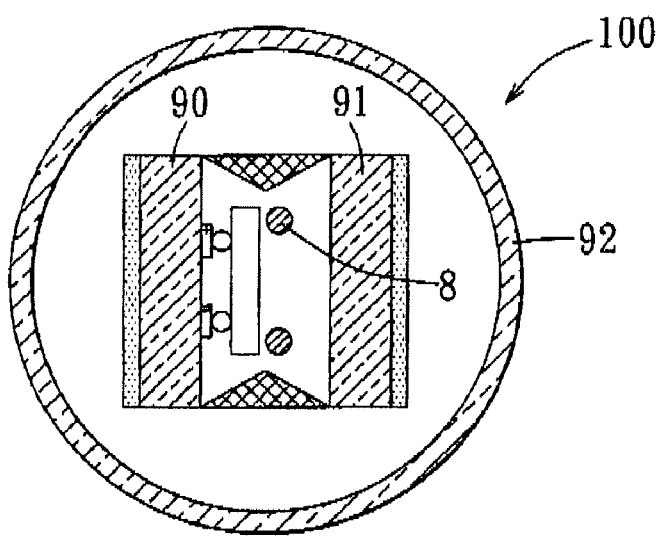
FIG. 23 is a partly sectional view of the seventeenth preferred embodiment of a light-emitting device according to this invention.
Figure 24:
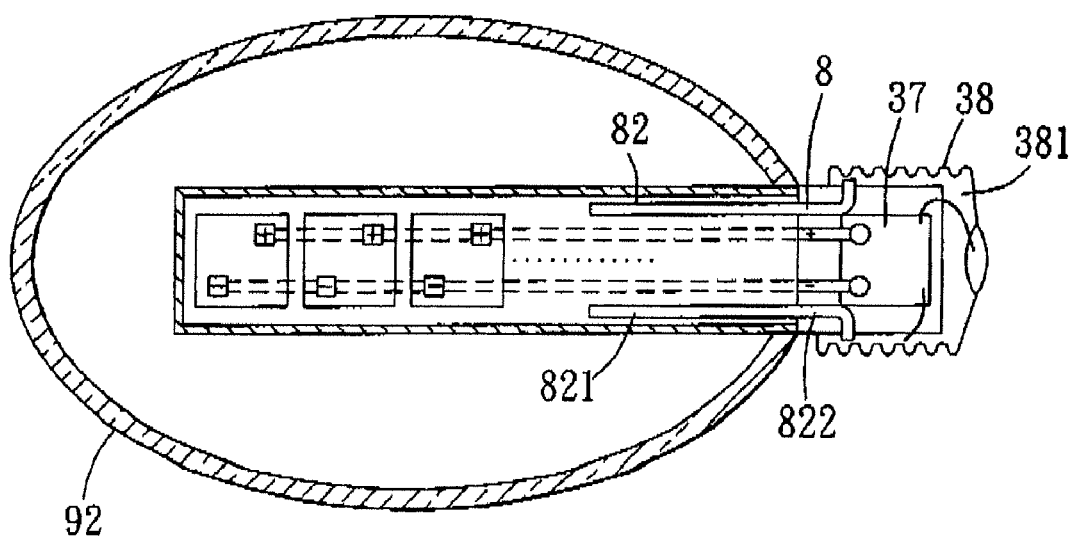
FIG. 24 is a partly sectional view illustrating a bulb housing and a screw base of the seventeenth preferred embodiment.

FIGS. 23 and 24 illustrate the seventeenth preferred embodiment of a light-emitting device 100 according to this invention. When compared to the fifteenth preferred embodiment, the light-emitting device 100 of this embodiment may be applied to replace a conventional screw-based light bulb. In particular, the thermally conductive bases 80 and the thermally conductive fin units 81 of the heat-dissipating unit 8 (see FIG. 19) are dispensed with. The light-emitting device 100 further includes a bulb housing 92 that encloses the first and second light-transmissible substrates 90, 91. The coupling unit 38 includes a screw base 381 that is disposed externally of the bulb housing 1, that encloses the ac-to-dc converter 37 and the second end portions 822 of the thermally conductive elements 82 of the heat-dissipating unit 8, that is connected electrically to the input side of the ac-to-dc converter 37, and that is formed with an outer thread for threadedly engaging the ac power source (AC) (see FIG. 19).

Figure 25:
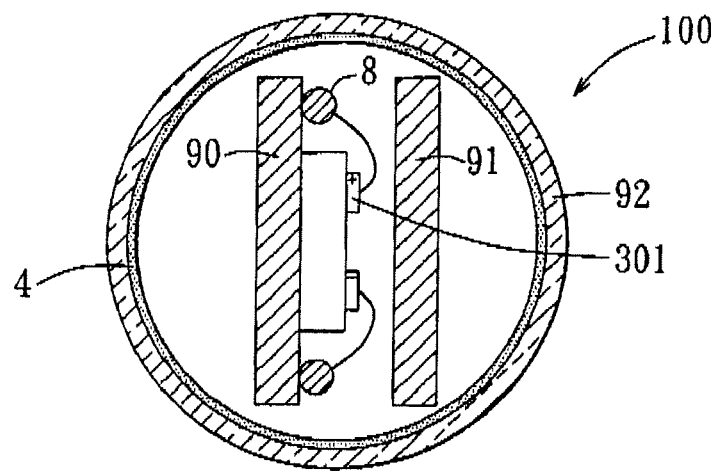
FIG. 25 is a partly sectional view of the eighteenth preferred embodiment of a light-emitting device according to this invention.
Figure 26:
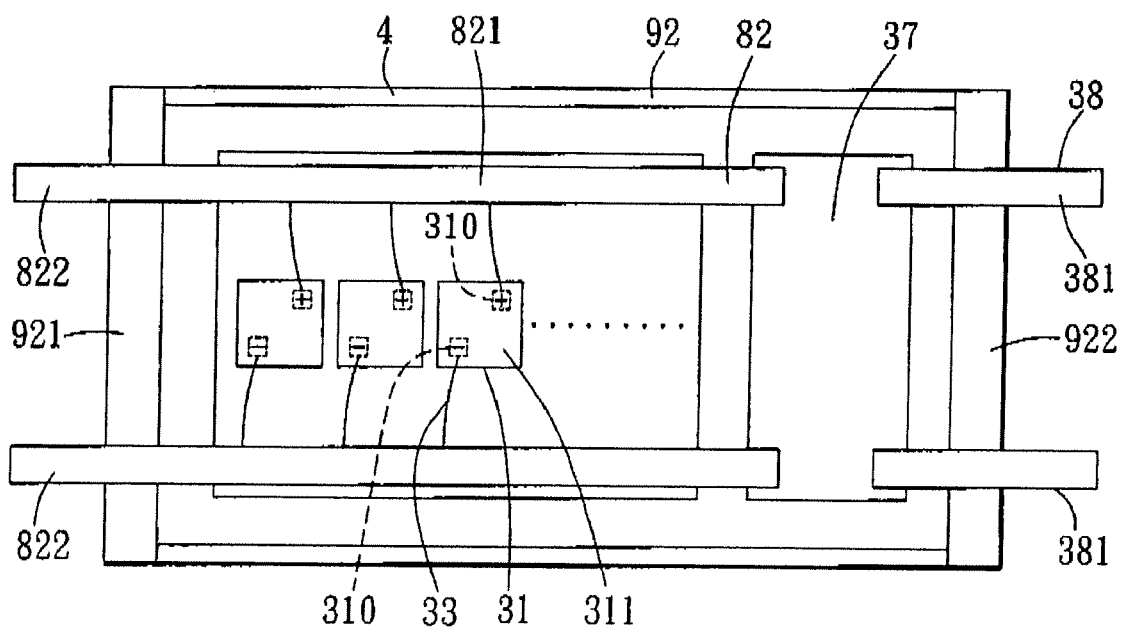
FIG. 26 is a partly sectional view illustrating a tubular housing and a pair of pins of the eighteenth preferred embodiment.

FIGS. 25 and 26 illustrate the eighteenth preferred embodiment of a light-emitting device 100 according to this invention. When compared to the fifteenth preferred embodiment, the light-emitting device 100 of this embodiment may be applied to replace a conventional pin-based fluorescent lamp. In particular, the leads 32 (see FIG. 19), and the first and second thermally conductive base 80 and the first and second thermally conductive fin units 81 of the heat-dissipating unit 8 (see FIG. 19) are dispensed with. The light-emitting device 100 further includes a tubular housing 92 that encloses the first and second light-transmissible substrates 90, 91 and the ac-to-dc converter 37. The fluorescent layer 4 is coated on an inner surface of the tubular housing 92. Each of the electrical contacts 301 is mounted on and is connected electrically to the first end portion 821 of a respective one of the thermally conductive elements 82 of the heat-dissipating unit 8. Each of the conductive contacts 310 of the light-emitting chip 311 of the light-emitting unit 31 is connected electrically to a respective one of the electrical contacts 301 through a respective one of electrical wires 33. The output side of the ac-to-dc converter 37 is connected electrically to the first end portions 821 of the thermally conductive elements 82 of the heat-dissipating unit 8. The second end portions 822 of the thermally conductive elements 82 of the heat-dissipating unit 8 extend externally of the tubular housing 92 through a first end 921 of the tubular housing 92. The coupling unit 38 includes a pair of pins 381 that are connected electrically to the input side of the ac-to-dc converter 37, that extends externally of the tubular housing 92 through a second end 922 of the tubular housing 92, and that is adapted to be connected electrically to the ac power source (AC) (see FIG. 19).

Figure 27:
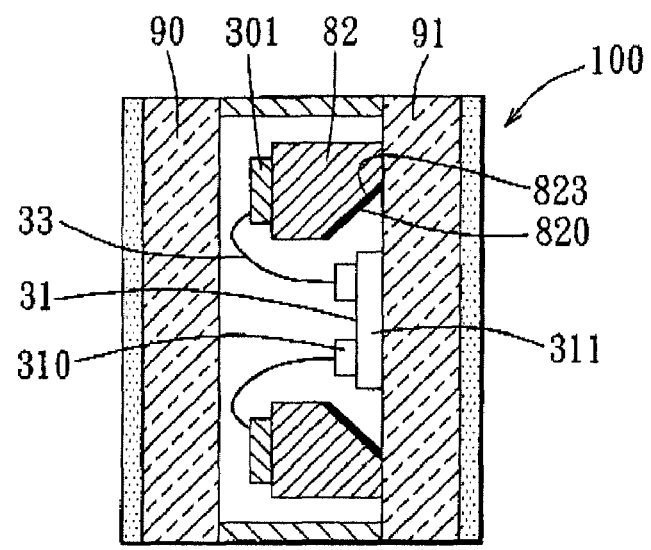
FIG. 27 is a partly sectional view of the nineteenth preferred embodiment of a light-emitting device according to this invention.
Figure 28:
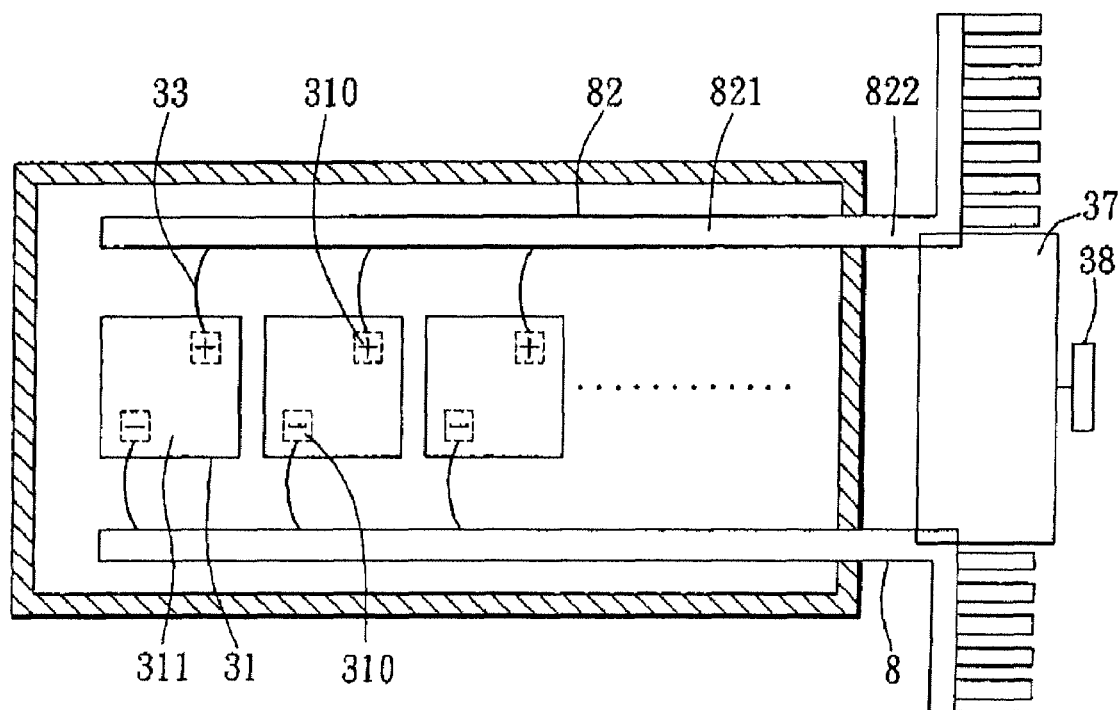
FIG. 28 is a partly sectional view illustrating a heat-dissipating unit of the nineteenth preferred embodiment.

FIGS. 27 and 28 illustrate the nineteenth preferred embodiment of a light-emitting device 100 according to this invention. When compared to the fifteenth preferred embodiment, the leads 32 (see FIG. 19) are dispensed with. The light-emitting chip 311 of the light-emitting unit 31 is mounted on the second transmissible substrate 91. Each of the electrical contacts 301 is mounted on and is connected electrically to the first end portion 821 of a respective one of the thermally conductive element 82 of the heat-dissipating unit 8. Each of the conductive contacts 310 of the light-emitting chip 311 of the light-emitting unit 31 is connected electrically to a respective one of the electrical contacts 301 through a respective one of the electrical wires 33. The output side of the ac-to-dc converter 37 is connected electrically to the second end portions 822 of the thermally conductive elements 82 of the heat-dissipating unit 8. In this embodiment, each of the thermally conductive elements 82 of the heat-dissipating unit 8 has a slanted surface 823 coated with a reflective layer 820 to thereby increase reflective efficiency thereof.

Figure 29:
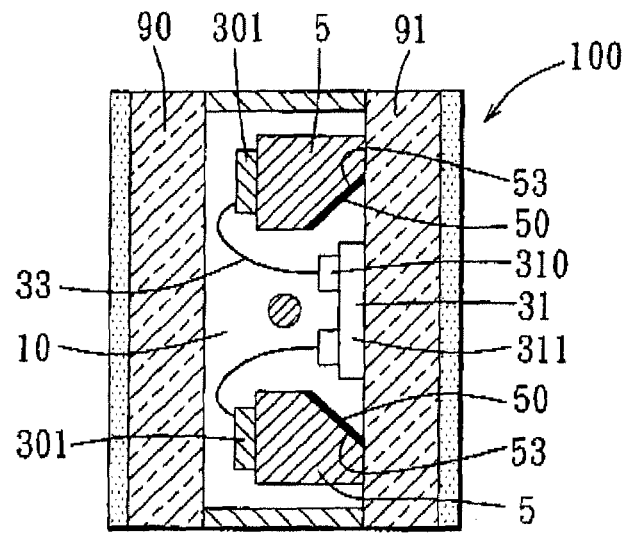
FIG. 29 is a partly sectional view of the twentieth preferred embodiment of a light-emitting device according to this invention.
Figure 30:
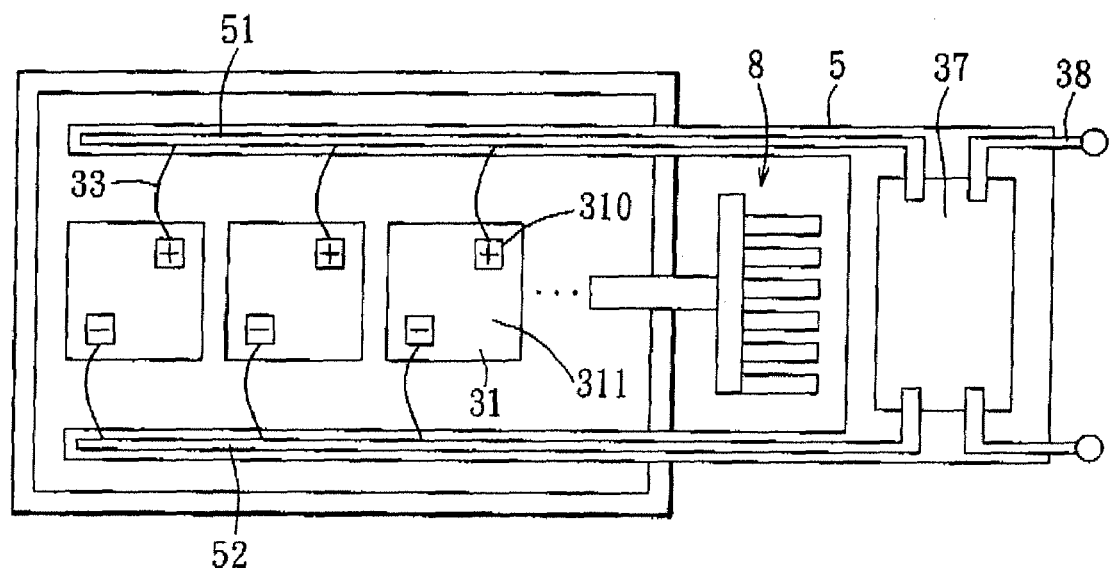
FIG. 30 is a partly sectional view illustrating a circuit board of the twentieth preferred embodiment.

FIGS. 29 and 30 illustrate the twentieth preferred embodiment of a light-emitting device 100 according to this invention. When compared to the fifteenth preferred embodiment, the leads 32 (see FIG. 19) are dispensed with. The light-emitting chip 311 of the light-emitting unit 31 is mounted on the second transmissible substrate 91. The light-emitting device 100 further includes a circuit board 5 that extends into the accommodating space 10, and that is formed with first and second electrical traces 51, 52. Each of the electrical contacts 301 is formed on the circuit board 5, and connected electrically to a respective one of the electrical traces 51, 52. Each of the conductive contacts 310 of the light-emitting chip 311 of the light-emitting unit 31 is connected electrically to a respective one of the electrical contacts 301 through a respective one of electrical wires 33. The ac-to-dc converter 37 is mounted on the circuit board 5. The output side of the ac-to-dc converter 37 is connected electrically to the electrical contacts 301 through the first and second electrical traces 51, 52. The coupling unit 38 is mounted on the circuit board 5, and coupled electrically to the input side of the ac-to-dc converter 38. In this embodiment, the circuit board 5 has a pair of slanted surfaces 53, each of which is coated with a reflective layer 50 to thereby increase reflective efficiency thereof.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A light-emitting device, comprising:
a housing including complementary first and second housing parts that cooperatively define an accommodating space therebetween;
a light-emitting unit disposed in said accommodating space in said housing, and including a light-emitting chip that has a plurality of conductive contacts;
a plurality of leads, each of which extends into said accommodating space in said housing and is coupled electrically to a respective one of said conductive contacts of said light-emitting chip of said light-emitting unit; and
a cup-shaped reflector disposed in said accommodating space in said housing and mounted on said first housing part for reflecting light emitted from said light-emitting chip of said light-emitting unit toward said second housing part, said cup-shaped reflector including:
a base wall that is formed with a plurality of holes therethrough; and
a surrounding wall that diverges from said base wall thereof and that surrounds said light-emitting unit.

2. The light-emitting device as claimed in claim 1, wherein said light-emitting chip of said light-emitting unit is one of a light-emitting diode chip and a laser diode chip.

3. The light-emitting device as claimed in claim 1, wherein said cup-shaped reflector has an inner surface coated with a fluorescent layer.

4. The light-emitting device as claimed in claim 3, wherein said fluorescent layer generates light of a wavelength in one of ranges from 400 nm to 470 nm, from 500 nm to 560 nm, from 600 nm to 620 nm, and from 250 nm to 380 nm when excited by the light generated by said light-emitting chip of said light-emitting unit.

5. The light-emitting device as claimed in claim 1, further comprising a mounting unit disposed in said accommodating space in said housing, said mounting unit including
a light-transmissible substrate, said light-emitting chip of said light-emitting unit being mounted on said light-transmissible substrate,
a plurality of electrical contacts mounted on said light-transmissible substrate, each of said leads being connected electrically and directly to a respective one of said electrical contacts, and
a plurality of conductive wires, each of which interconnects a respective one of said electrical contacts to a respective one of said conductive contacts of said light-emitting chip of said light-emitting unit.

6. The light-emitting device as claimed in claim 5, wherein each of said electrical contacts is made from one of an indium tin oxide material and an indium zinc oxide material.

7. The light-emitting device as claimed in claim 5, wherein said light-transmissible substrate has a mounting surface that extends transversely to said base wall of said cup-shaped reflector, said light-emitting unit and said electrical contacts being mounted on said mounting surface of said light-transmissible substrate.

8. The light-emitting device as claimed in claim 1, wherein said housing is generally cylindrical in shape.

9. The light-emitting device as claimed in claim 1, wherein said light-emitting chip of said light-emitting unit emits one of a red light, a green light, and a blue light.

10. The light-emitting device as claimed in claim 1, further comprising a non-conductive coolant contained in said accommodating space in said housing.

11. The light-emitting device as claimed in claim 10, further comprising a fluorescent powder mixed with said non-conductive coolant.

12. The light-emitting device as claimed in claim 1, wherein said light-emitting chip has a mounting surface that extends transversely to said base wall of said cup-shaped reflector, said conductive contacts of said light-emitting chip being mounted on said mounting surface.

* * * * *